US009245646B2

(12) United States Patent
Moschiano et al.

(10) Patent No.: US 9,245,646 B2
(45) Date of Patent: Jan. 26, 2016

(54) PROGRAM VERIFY OPERATION IN A MEMORY DEVICE

(71) Applicant: MICRON TECHNOLOGY, INC., Boise, ID (US)

(72) Inventors: Violante Moschiano, Avezzano (IT); Giovanni Santin, Rieti (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/528,251

(22) Filed: Oct. 30, 2014

(65) Prior Publication Data
US 2015/0049556 A1 Feb. 19, 2015

Related U.S. Application Data

(63) Continuation of application No. 12/949,876, filed on Nov. 19, 2010, now Pat. No. 8,879,329.

(51) Int. Cl.
*G11C 11/34* (2006.01)
*G11C 16/34* (2006.01)
*G11C 11/56* (2006.01)
*G11C 16/26* (2006.01)

(52) U.S. Cl.
CPC ........ *G11C 16/3459* (2013.01); *G11C 11/5628* (2013.01); *G11C 16/26* (2013.01)

(58) Field of Classification Search
None
See application file for complete search history.

(56) References Cited

U.S. PATENT DOCUMENTS

| 5,638,320 | A  | 6/1997  | Wong et al.    |
|-----------|----|---------|----------------|
| 6,038,166 | A  | 3/2000  | Wong           |
| 6,366,496 | B1 | 4/2002  | Torelli et al. |
| 7,196,927 | B2 | 3/2007  | Tran et al.    |
| 7,417,900 | B2 | 8/2008  | Rolandi et al. |
| 7,450,427 | B2 | 11/2008 | Yamada         |
| 7,558,120 | B2 | 7/2009  | Takai          |
| 7,800,951 | B2 | 9/2010  | Sutardja       |
| 7,864,589 | B2 | 1/2011  | Sarin et al.   |
| 8,023,334 | B2 | 9/2011  | Hoei et al.    |
| 8,243,523 | B2 | 8/2012  | Pabustan et al.|
| 8,254,180 | B2 | 8/2012  | Hoei et al.    |
| 2009/0021987 | A1 | 1/2009 | Sarin et al.  |
| 2010/0039863 | A1 | 2/2010 | Sarin et al.  |
| 2011/0051514 | A1 | 3/2011 | Han et al.    |
| 2011/0242900 | A1 | 10/2011| Hoei          |
| 2012/0176846 | A1 | 7/2012 | Sutardja      |

*Primary Examiner* — Kretelia Graham
(74) *Attorney, Agent, or Firm* — Dicke, Billig & Czaja, PLLC

(57) ABSTRACT

Methods for program verifying a memory cell include generating an access line voltage in response to a count and applying the access line voltage to a control gate of the memory cell, and generating a pass signal in response to the access line voltage activating the memory cell. Methods further include comparing at least a portion of the count to an indication of a desired threshold voltage of the memory cell, and when the at least a portion of the count matches the indication of the desired threshold voltage of the memory cell, determining if the pass signal is present. Methods further include generating a signal indicative of a desire to inhibit further programming of the memory cell if the pass signal is present when the match is indicated.

20 Claims, 4 Drawing Sheets

US 9,245,646 B2

PROGRAM VERIFY OPERATION IN A MEMORY DEVICE

RELATED APPLICATION

This Application is a Continuation of U.S. application Ser. No. 12/949,876, titled "PROGRAM VERIFY OPERATION IN A MEMORY DEVICE," filed Nov. 19, 2010, (Allowed), which is commonly assigned and incorporated herein by reference.

TECHNICAL FIELD

The present embodiments relate generally to memory and a particular embodiment relates to program verify of a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

A programming operation typically comprises a series of incrementally increasing programming pulses that are applied to a control gate of a memory cell being programmed. A program verify operation after each programming pulse determines the threshold voltage of the memory cell resulting from the preceding programming pulse.

A typical program verify operation includes storing a target threshold voltage in a page buffer that is coupled to each data line (e.g., bit line) and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare if the present threshold voltage is greater than or equal to the stored target threshold voltage. If the present threshold voltage is greater than or equal to the target threshold voltage, further programming is inhibited.

Performing a "greater than" comparison in the page buffer uses additional circuitry. For example, each page buffer might use two additional transistors just to perform the "greater than" comparison. Since each bit line is coupled to a different page buffer and a typical NAND flash memory device can have hundreds of thousands of bit lines, the additional circuitry just to perform the "greater than" comparison can add up to be millions of transistors. Such a large number of transistors take up valuable real estate on the integrated circuit die that can be used for additional memory cells.

For the reasons stated above, and for other reasons that will become apparent to those skilled in the art upon reading and understanding the present specification, there is a need in the art for reducing the size of comparison circuitry in a memory device.

DETAILED DESCRIPTION

Figure 1:
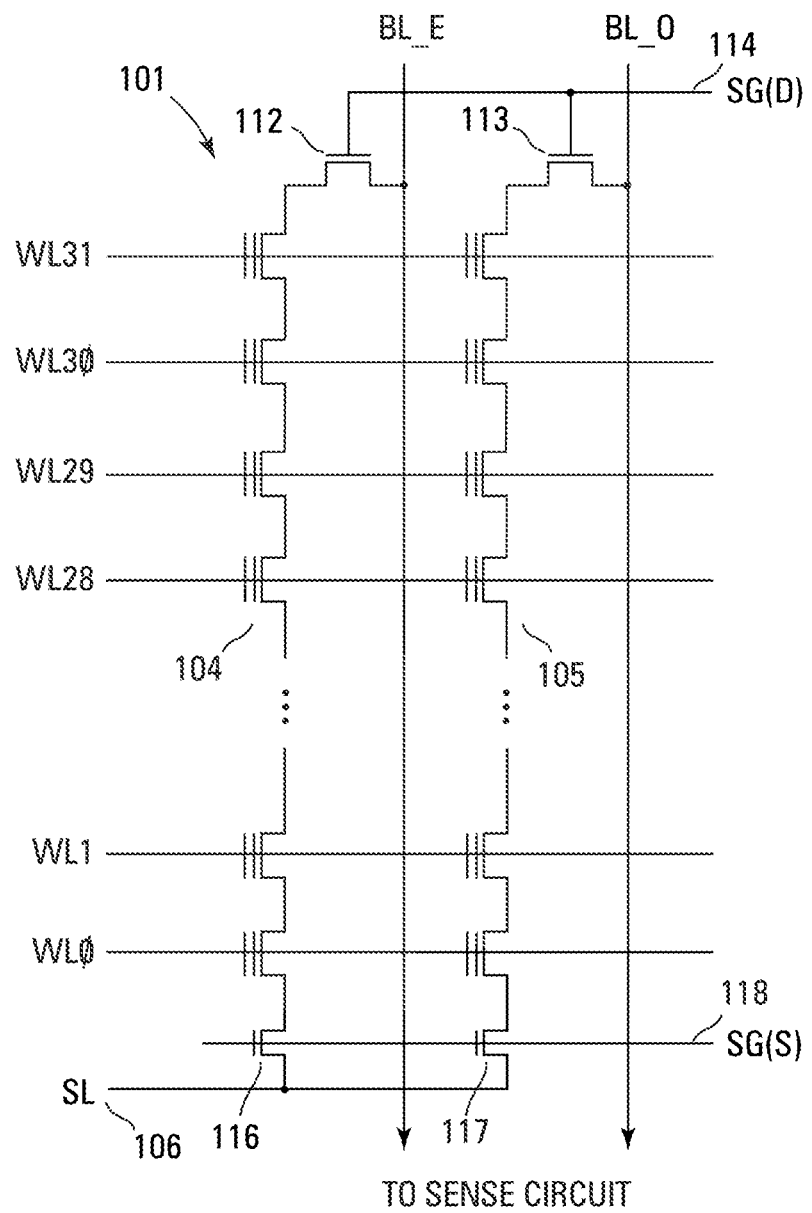
FIG. 1 shows a schematic diagram of a portion of one embodiment of a NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The schematic diagram of FIG. 1 is for purposes of illustration only as the memory array architecture is not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells is coupled drain to source in each series string 104, 105. An access line (e.g. word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or a multiple level cell (MLC). Each cell's threshold voltage ($V_t$) is indicative of the data that is stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

During a program verify operation, a word line digital-to-analog converter (DAC) generates a ramped voltage, from a digital count, that is applied via a word line to the control gate of each selected memory cell. When the ramped voltage reaches the voltage to which the selected memory cell is programmed (e.g., $V_t$), the selected memory cell conducts and generates a current on the bit line to which it is coupled. The digital count that generated the particular voltage that activated the selected memory cell can then be used as being indicative of the particular voltage.

Figure 2:
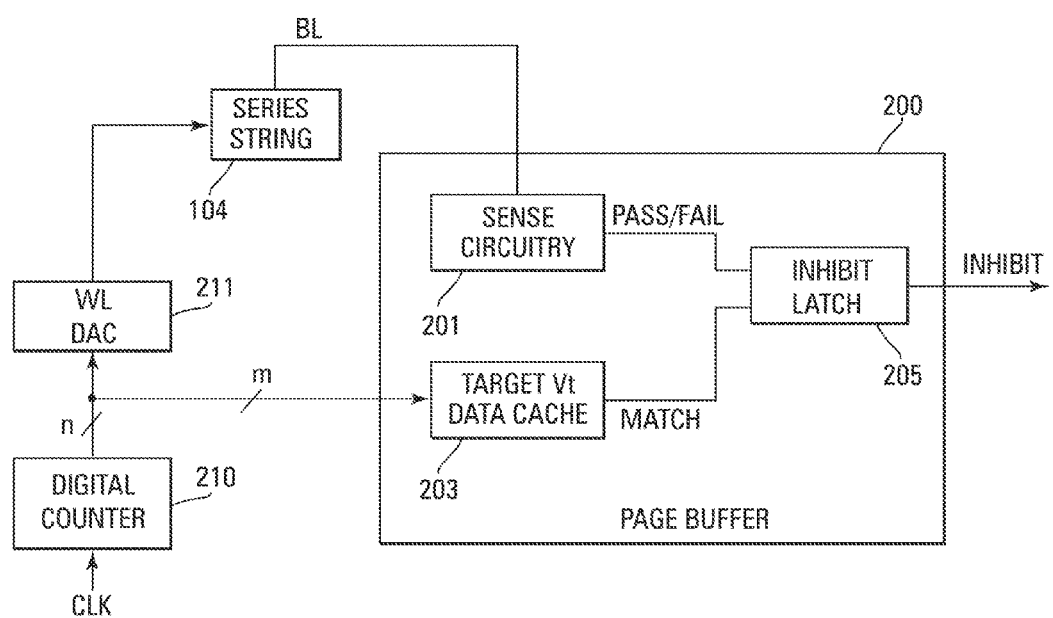
FIG. 2 shows a block diagram of one embodiment of a program verify circuit.

FIG. 2 illustrates a block diagram of one embodiment of a page buffer 200 that is coupled to one of the bit lines of FIG. 1. Each bit line of a memory array can be coupled to a different page buffer. In one embodiment, each page buffer is substantially similar to the block diagram of FIG. 2.

FIG. 2 also illustrates an example of a digital counter 210 and digital-to-analog converter (DAC) 211. The digital counter 210 is an n-bit digital counter that inputs an incrementing digital count signal to the DAC 211. The DAC 211 uses the digital count to generate the ramped voltage.

The page buffer 200 includes sense circuitry (e.g., sense amplifier) 201 that is coupled to the bit line. The sense circuitry 201 is responsible for detecting a current on the bit line when a selected memory cell that is coupled to the bit line is activated. The sense circuitry 201 is configured to output a pass/fail signal in response to the detected current. The pass signal (e.g., a positive pulse) indicates that a current was detected. The fail signal (e.g., no pulse) indicates that a current has not been detected.

The page buffer 200 further includes match circuitry, such as a target threshold voltage data cache 203 that is coupled to the n-bit digital counter 210. The target threshold voltage data cache 203 is configured to store an indication of a desired target $V_t$ at the start of a programming operation. In one embodiment, the indication of the target $V_t$ is stored as a digital representation of the threshold voltage. The digital representation of the threshold voltage, in one embodiment, is the digital count that generates the particular voltage, of a ramped voltage, that activates the selected memory cell. In an alternate embodiment, the indication of the target $V_t$ may be stored as an analog voltage.

The digital count from the digital counter 210, in the illustrated embodiment, is an m-bit digital word. In one embodiment, m<n. In such an embodiment, the indication of the target Vt should also be an m-bit digital word. In an alternate embodiment, m can equal n.

The output of the target threshold voltage data cache 203 is a match signal (e.g., positive pulse) that indicates when the digital count (or, in the case of m<n, when at least a portion of the digital count) from the n-bit counter 210 matches the target $V_t$ stored at the start of the programming operation. The target threshold voltage data cache 203 performs a comparison when a digital count (or at least a portion of the digital count, such as when m<n) is input to the target threshold data cache 203 and outputs the match signal when the two digital values match.

The page buffer 200 further includes an inhibit latch 205 that is coupled to both the sense circuitry 201 and the target threshold voltage data cache 203. The inhibit latch 205 is set when both the MATCH signal and the PASS/FAIL signal are true. In other words, the inhibit latch is set when the PASS/FAIL signal indicates that current has been detected on the bit line and the MATCH signal indicates that the stored $V_t$ is equal to the digital count input to the page buffer 200. The INHIBIT signal is an indication that the selected memory cell is programmed to the target threshold voltage.

The INHIBIT signal indicates to the memory control circuitry to inhibit further programming of the selected memory cell. In one embodiment, the memory control circuitry controls biasing of the bit lines during programming of the memory cells. A bit line that is biased at 0V enables memory cells coupled to that particular bit line to be programmed by the proper word line programming voltage. Increasing the bit line voltage slows the programming of the memory cells coupled to that particular bit line. The memory control circuitry can control generation of an inhibit voltage (e.g., $V_{CC}$) to bias the selected bit line when the INHIBIT signal is true.

Figure 3:
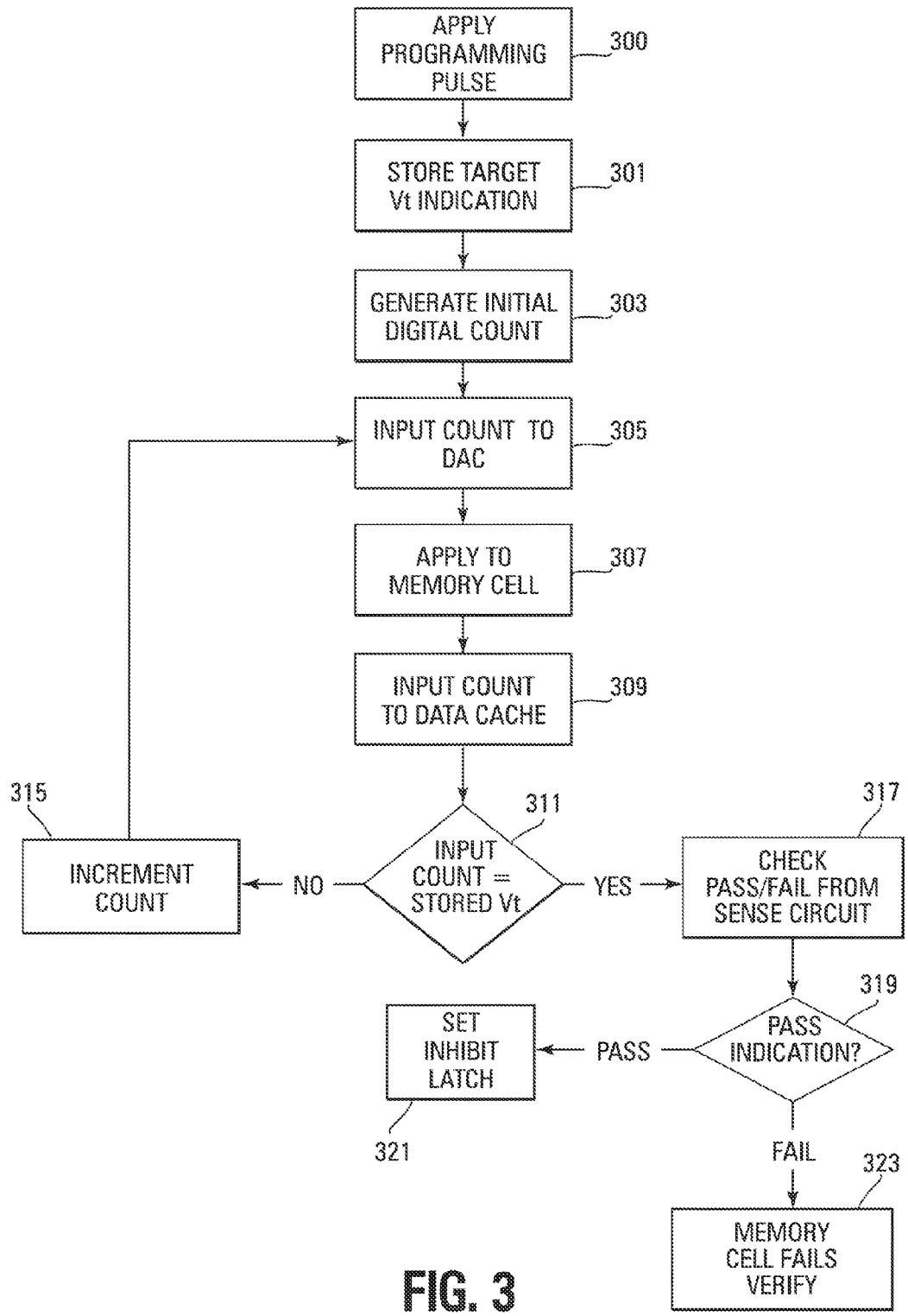
FIG. 3 shows a flowchart of one embodiment of a program verify operation in accordance with the program verify circuit of FIG. 2.

A flowchart of one embodiment of a program verify operation, in accordance with FIG. 2, is illustrated in FIG. 3. Reference can be made to FIG. 2 for operation of the various components of the block diagram.

A programming pulse is applied to the control gate of the selected memory cell 300 via a selected word line. The programming pulse can increase the threshold voltage of the memory cell being programmed. An indication of a target $V_t$ (e.g., digital data) is stored in the target threshold voltage data cache 301 prior to attempting to verify the memory cell. An initial digital count is generated 303 and input to the DAC 305 to begin generation of the ramped voltage that is applied 307, via a word line, to a control gate of each selected memory cell coupled to the selected word line. The digital count or a particular number of bits of the digital count is input to the target threshold voltage data cache 309. Each digital count of the count signal that is input to the target threshold voltage data cache is compared to the stored target $V_t$ 311.

If the digital count is not equal to the stored target $V_t$ 311 the counter is incremented 315 and the incremented count is input to the DAC 305. The ramped voltage continues to be generated and the count compared to the target $V_t$ until the input count is equal to the stored target $V_t$ 311. The sense circuitry is then checked for the PASS/FAIL signal 317.

If the PASS/FAIL signal indicates a PASS condition 319, the inhibit latch is set 321 to indicate that the threshold voltage of the memory cell has reached the stored target $V_t$. Further programming of the selected memory cell can now be inhibited.

If the PASS/FAIL signal indicates a FAIL condition 319, the verify operation that particular memory cell has failed 323. Even though the DAC counter and DAC will continue to generate a ramped voltage for other memory cells being verified on the same word line, the particular memory cell that failed can receive another programming pulse and the program verify operation repeated.

Figure 4:
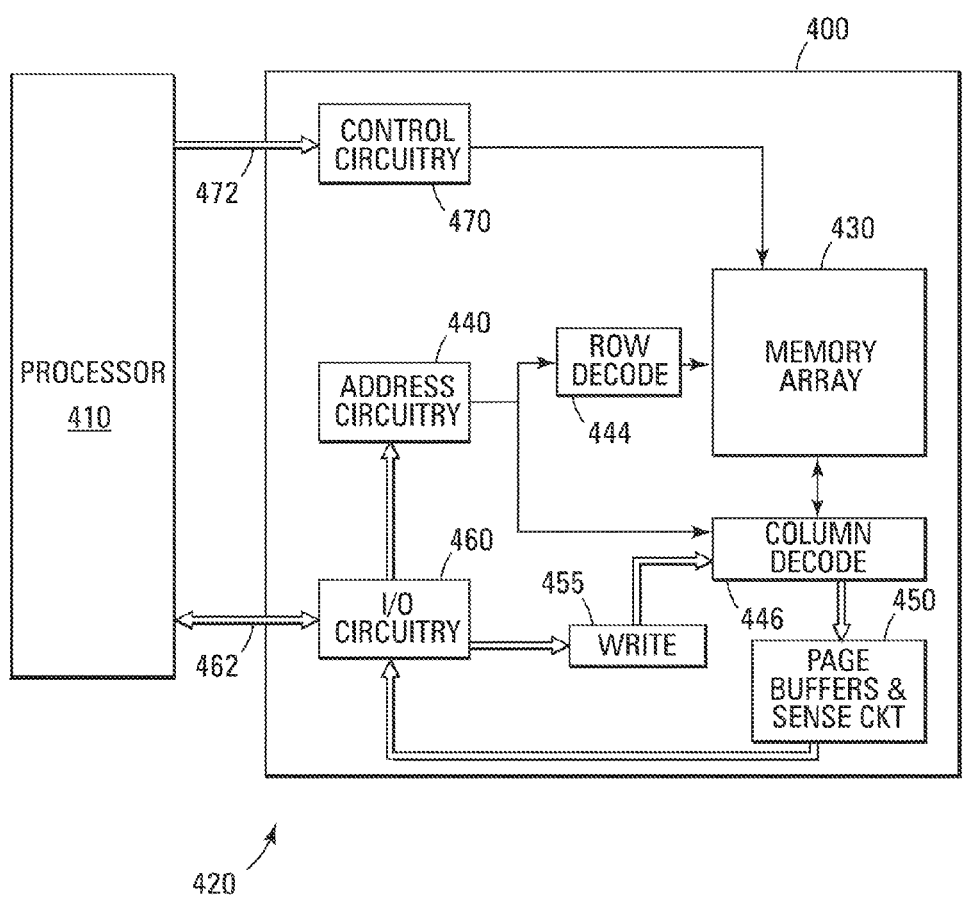
FIG. 4 shows a block diagram of one embodiment of a memory system that can incorporate the program verify circuit of FIG. 2.

FIG. 4 illustrates a functional block diagram of a memory device 400. The memory device 400 is coupled to an external processor 410. The processor 410 may be a microprocessor or some other type of controller. The memory device 400 and the processor 410 form part of a memory system 420.

The memory device 400 includes an array 430 of memory cells (e.g., non-volatile memory cells). The memory array 430 is arranged in banks of word line rows and bit line columns. In one embodiment, the columns of the memory array 430 comprise series strings of memory cells.

Address buffer circuitry 440 is provided to latch address signals provided through I/O circuitry 460. Address signals are received and decoded by a row decoder 444 and a column decoder 446 to access the memory array 430.

The memory device 400 reads data in the memory array 430 by sensing voltage or current changes in the memory array columns using sense amplifier circuitry 450. The page buffers 450, in one embodiment, are coupled to read and latch a row of data from the memory array 430. The page buffers 450, as previously described, include the sense circuitry as well as other circuits for performing a program verify operation. Data input and output buffer circuitry 460 is included for bidirectional data communication as well as the address communication over a plurality of data connections 462 with the controller 410. Write circuitry 455 is provided to write data to the memory array.

Memory control circuitry 470 decodes signals provided on control connections 472 from the processor 410. These signals are used to control the operations on the memory array 430, including data read, data write (program), and erase operations. The memory control circuitry 470 may be a state machine, a sequencer, or some other type of controller to generate the memory control signals. In one embodiment, the memory control circuitry 470 is configured to control execution of the program verify embodiments of the present disclosure.

The memory device illustrated in FIG. 4 has been simplified to facilitate a basic understanding of the features of the memory. A more detailed understanding of internal circuitry and functions of flash memories are known to those skilled in the art.

CONCLUSION

In summary, one or more embodiments of the program verify operation and program verify circuit can provide a program verify function of a memory cell using a reduced quantity of components as compared to the prior art. The circuit typically used for the "greater than" function in the page buffer can be eliminated by comparing at least a portion of a count, used to generate a ramped word line voltage, with a stored target $V_t$. When the at least a portion of the count and target $V_t$ are equal, a sense circuitry is then checked to determine if the memory cell has been activated by the voltage generated by the count. If the memory cell is activated, further programming of the memory cell can be inhibited. Otherwise, the memory cell continues with the programming operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method of program verifying a memory cell, comprising:
   generating an access line voltage in response to a count and applying the access line voltage to a control gate of the memory cell;
   generating a pass signal in response to the access line voltage activating the memory cell;
   comparing at least a portion of the count to an indication of a desired threshold voltage of the memory cell;
   when the at least a portion of the count matches the indication of the desired threshold voltage of the memory cell, determining if the pass signal is present; and
   if the pass signal is present when the match is indicated, generating a signal indicative of a desire to inhibit further programming of the memory cell.

2. The method of claim 1, wherein generating a pass signal in response to the access line voltage activating the memory cell comprises:
   detecting current on a data line coupled to the memory cell as an indication of activation of the memory cell; and
   generating the pass signal when the current on the data line is detected.

3. The method of claim 1, wherein generating a pass signal in response to the access line voltage activating the memory cell comprises generating a positive pulse in response to detecting current flow through the memory cell.

4. The method of claim 1, further comprising:
   generating a match signal when the at least a portion of the count matches the indication of the desired threshold voltage of the memory cell;
   determining if the pass signal is present in response to generating the match signal; and
   generating the signal indicative of a desire to inhibit further programming of the memory cell when the match signal and the pass signal are concurrently present.

5. The method of claim 4, further comprising:
   determining if the pass signal is present by determining if a positive pulse is present at the output of sense circuitry sensing current flow through the memory cell; and
   determining if the match signal is present by determining if a positive pulse is present at the output of match circuitry comparing the at least a portion of the count to the indication of the desired threshold voltage of the memory cell.

6. The method of claim 1, further comprising inhibiting further programming of the memory cell in response to the signal indicative of a desire to inhibit further programming of the memory cell.

7. A method of program verifying a memory cell, comprising:
   generating an access line voltage in response to a count, and applying the access line voltage to a control gate of the memory cell;
   generating a first signal having a particular value in response to the access line voltage activating the memory cell;
   comparing at least a portion of the count to an indication of a desired threshold voltage of the memory cell;
   generating a second signal having a particular value when the at least a portion of the count matches the indication of the desired threshold voltage of the memory cell; and
   generating a third signal indicative of a desire to inhibit further programming of the memory cell in response to the first signal having its particular value while the second signal has its particular value.

8. The method of claim 7, wherein comparing at least a portion of the count to an indication of a desired threshold voltage of the memory cell comprises comparing the at least a portion of the count to the indication of the desired threshold voltage of the memory cell for each count value of a plurality of count values of the count.

9. The method of claim 8, wherein generating an access line voltage in response to a count comprises generating an increasing access line voltage in response to a plurality of count values of the count.

10. The method of claim 7, wherein comparing at least a portion of the count to an indication of a desired threshold voltage of the memory cell comprises comparing at least a portion of a count value of the count when activation of the memory cell is detected, to the indication of the desired threshold voltage of the memory cell.

11. The method of claim 7, wherein generating a first signal having a particular value in response to the access line voltage activating the memory cell comprises generating the first signal having the particular value when current flow through the activated memory cell is detected.

12. A method of program verifying a memory cell, comprising:
- generating an increasing access line voltage in response to a plurality of count values, and applying the increasing access line voltage to a control gate of the memory cell;
- generating a first signal having a particular value in response to a particular voltage of the increasing access line voltage activating the memory cell;
- comparing at least a portion of each count value of the plurality of count values to an indication of a desired threshold voltage of the memory cell;
- generating a second signal having a particular value when the at least a portion of a particular count value of the plurality of count values matches the indication of the desired threshold voltage of the memory cell; and
- generating a third signal indicative of a desire to inhibit further programming of the memory cell in response to the first signal having its particular value while the second signal has its particular value.

13. The method of claim 12, wherein generating a first signal having a particular value in response to a particular voltage of the increasing access line voltage activating the memory cell comprises:
- sensing for current through the memory cell while applying the increasing access line voltage;
- generating the first signal having the particular value when current through the memory cell is detected; and
- generating the first signal having a value other than the particular value when current through the memory cell is not detected.

14. The method of claim 12, further comprising:
detecting the activation of the memory cell by detecting a current on a data line coupled to the memory cell.

15. The method of claim 12, wherein comparing at least a portion of each count value of the plurality of count values to an indication of a desired threshold voltage of the memory cell comprises comparing each count value to the indication of the desired threshold voltage of the memory cell.

16. The method of claim 12, wherein comparing at least a portion of each count value of the plurality of count values to the indication of the desired threshold voltage of the memory cell comprises comparing at least a portion of a digital count value to a digital value configured to generate a voltage of the increasing access line voltage that would activate the memory cell having the desired threshold voltage.

17. The method of claim 12, wherein the particular value of the first signal and the particular value of the second signal have a same value.

18. The method of claim 12, further comprising:
inhibiting further programming of the memory cell in response to the third signal.

19. The method of claim 12, further comprising:
generating the plurality of count values as a plurality of incrementing digital count values.

20. The method of claim 19, wherein the at least a portion of each count value is a number of digits of each count value that is less than or equal to a total number of digits of each count value.

* * * * *